(12) United States Patent
Joo et al.

(10) Patent No.: US 7,518,943 B2
(45) Date of Patent: Apr. 14, 2009

(54) EMBEDDED MEMORY AND METHODS THEREOF

(75) Inventors: Jong-Doo Joo, Seongnam-si (KR); Cheol-Ha Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 20 days.

(21) Appl. No.: 11/644,898

(22) Filed: Dec. 26, 2006

(65) Prior Publication Data

US 2007/0201289 A1 Aug. 30, 2007

(30) Foreign Application Priority Data

Feb. 24, 2006 (KR) .................. 10-2006-0018424

(51) Int. Cl.
*G11C 11/00* (2006.01)
(52) U.S. Cl. .................. 365/230.06; 365/200
(58) Field of Classification Search .......... 365/200, 365/230.06
See application file for complete search history.

(56) References Cited

U.S. PATENT DOCUMENTS

| | | | |
|---|---|---|---|
| 5,905,737 A * | 5/1999 | Osawa et al. ............. | 714/726 |
| 6,469,949 B1 | 10/2002 | Hsu et al. | |
| 6,603,690 B1 * | 8/2003 | Chen et al. ............... | 365/200 |
| 6,667,918 B2 * | 12/2003 | Leader et al. ............ | 365/201 |
| 6,732,229 B1 * | 5/2004 | Leung et al. ............. | 711/109 |
| 6,816,420 B1 * | 11/2004 | Liu et al. ................. | 365/200 |
| 6,992,937 B2 * | 1/2006 | Tran et al. ............... | 365/200 |

(Continued)

FOREIGN PATENT DOCUMENTS

JP 2003-107133 4/2003

(Continued)

*Primary Examiner*—Michael T Tran
(74) *Attorney, Agent, or Firm*—Harness, Dickey & Pierce, P.L.C.

(57) ABSTRACT

An embedded memory and methods thereof are provided. The example embedded memory may include a first memory block configured to output data, selected by a first column select signal, on a first scan output line if the first memory block is determined to be non-defective and a second memory block configured to output data, selected by a second column select signal on a second scan output line if the first memory block is determined to be non-defective, the second memory block further configured to output data, selected by the first column select signal, on the first scan output line if the first memory block is determined to be defective. A first example method may include performing a memory scan on a plurality of cell arrays, determining whether at least one of a plurality of cell arrays is defective based on the results of the memory scan, receiving data to be stored in a first cell array of the plurality of cell arrays, storing the received data in the first cell array if the determining determines the first cell array not to be defective and storing the received data in a second cell array, if the determining determines the first cell array to be defective. A second example method may include retrieving data from an embedded memory, including receiving data on a first scan output line from a first cell array, included among a plurality of cell arrays, if the first cell array is not defective and receiving data on the first scan line from a second cell array if the first cell array is defective.

27 Claims, 7 Drawing Sheets

U.S. PATENT DOCUMENTS

| | | | |
|---|---|---|---|
| 7,170,801 B2 * | 1/2007 | Lee et al. | 365/200 |
| 7,263,642 B1 * | 8/2007 | Makar et al. | 714/736 |
| 7,286,380 B2 * | 10/2007 | Hsu et al. | 365/49.17 |
| 2002/0031017 A1 * | 3/2002 | Yumoto | 365/200 |
| 2002/0075733 A1 * | 6/2002 | Zheng et al. | 365/200 |
| 2004/0133826 A1 * | 7/2004 | Zhu et al. | 714/711 |
| 2004/0141384 A1 * | 7/2004 | Keeth et al. | 365/200 |
| 2005/0024956 A1 * | 2/2005 | Tran et al. | 365/200 |
| 2005/0144516 A1 * | 6/2005 | Gonzalez et al. | 714/8 |
| 2005/0162947 A1 * | 7/2005 | Kim et al. | 365/200 |
| 2007/0070734 A1 * | 3/2007 | Hsu et al. | 365/200 |

FOREIGN PATENT DOCUMENTS

| | | |
|---|---|---|
| JP | 2004-265468 | 9/2004 |

* cited by examiner

EMBEDDED MEMORY AND METHODS THEREOF

PRIORITY STATEMENT

This application claims the benefit of Korean Patent Application No. 10-2006-0018424, filed on Feb. 24, 2006, in the Korean Intellectual Property Office, the disclosure of which is incorporated herein in its entirety by reference.

BACKGROUND OF THE INVENTION

1. Field of the Invention

Example embodiments of the present invention relate generally to an embedded memory and methods thereof, and more particularly to an embedded memory, a method of repairing the embedded memory and a method of retrieving data from the embedded memory.

2. Description of the Related Art

A plurality of function blocks for controlling a display panel and a memory (e.g., which may be accessible to the plurality function blocks and/or a processor controlling the plurality of function blocks) may be embedded in a display driving integrated circuit (DDI). A conventional display panel may display a quarter video graphic array (QVGA) with a resolution of 640×480 pixels and 16 k colors, or alternatively a video graphic array (VGA) with a resolution of 320×200 pixels and 256 k colors. Memory requirements for QVGA may be larger than that of VGA.

Two types of conventional memory may include static random access memory (SRAM) and dynamic random access memory (DRAM). Generally, SRAM may occupy a larger area, per bit, than DRAM. Conventionally, SRAM may be used as the embedded memory in the DDI. However, because higher storage per area may be achieved with DRAM, DRAM may be used within DDIs to increase storage capacity while maintaining a relatively small size.

In SRAM, row failure may be relatively high, and accordingly a redundancy may be allocated to row blocks. In contrast, in DRAM, column failure may be relatively high, and accordingly a redundancy may be allocated to column blocks. Because the memory may be embedded in a single system, a memory scan may be performed by a scan block to facilitate the examination and repair of defective blocks within the memory. In addition, in order to reduce the power dissipation of the system, the scan block may be arranged over the memory region and directly connected to the memory region.

FIG. 1 is a conceptual diagram illustrating memory including scan blocks, column redundancy blocks, and a column redundancy repair function performed by a conventional memory.

Referring to FIG. 1, on the left side of the arrow, a layout of the memory including scan blocks and a column redundancy block may be shown, and on the right side of the arrow, a redundancy repair process may be shown.

Referring to FIG. 1, the conventional memory may include column selection line regions CSL<0> to CSL<n−1> to which a plurality of column selection signals may be applied, and cell arrays C/A<0> to C/A<n−1> in which data recorded in memory cells may be selected based on the column selection signals. Data selected within the cell arrays C/A<0> to C/A<n−1> may be transferred to corresponding scan blocks SCAN<0> to SCAN<n−1>, respectively. A redundancy cell array RC/A<0> may be arranged in parallel with the cell arrays C/A<0> to C/A<n−1>, and a redundancy column selection line region RCSL<0> may be arranged in parallel with the column selection line regions CSL<0> to CSL<n−1>. The redundancy column selection signals may be applied to the redundancy cell array RC/A<0> through the redundancy column selection line regions CSL<0> to CSL<n−1>.

Referring to FIG. 1, a column selection line region and a plurality of column selection signals passing through the column selection line region may use the same reference label. For example, a first column selection signal and a first column selection line region may use the same reference label CSL<0>.

Referring to FIG. 1, on the right side of the arrow, a redundancy repair may be performed by replacing an entire second cell array C/A<1> with a redundancy cell array RC/A<0> if at least one memory cell in the second cell array C/A<1> is defective. The second cell array C/A<1> may be replaced with the redundancy cell array RC/A<0> by controlling the second column selection signal CSL<1> and the redundancy column selection signal RCSL<0>.

Although not shown in FIG. 1, each output of the serially connected scan blocks may be directly connected to a corresponding peripheral circuit, and the corresponding peripheral circuit may examine the function of the cell array by analyzing received serial data.

Referring to FIG. 1, if a memory cell array and a scan block corresponding to the memory cell are directly connected to each other through a conductive (e.g., metallic) line, in the redundancy cell array RC/A<0>, a corresponding scan block may not be arranged. Therefore, data of the redundancy cell array RC/A<0> may not be read when a scan is performed. In order to reduce this problem, the corresponding scan block may be arranged in the redundancy cell array RC/A<0>. However, because the output data of the scan blocks may be serially transmitted, an additional circuit for correctly inserting information of the replaced cell array and an output of the scan block corresponding to the redundancy cell array into the serially transmitted data may be required to attain correct operation. An additional memory peripheral circuit may also be included. Therefore, a layout or size of the conventional memory may increase, as well as a design and/or fabrication time for the conventional memory.

SUMMARY OF THE INVENTION

An example embodiment of the present invention is directed to an embedded memory, including a first memory block configured to output data, selected by a first column select signal, on a first scan output line if the first memory block is determined to be non-defective and a second memory block configured to output data, selected by a second column select signal on a second scan output line if the first memory block is determined to be non-defective, the second memory block further configured to output data, selected by the first column select signal, on the first scan output line if the first memory block is determined to be defective.

Another example embodiment of the present invention is directed to a method of repairing an embedded memory, including performing a memory scan on a plurality of cell arrays, determining whether at least one of a plurality of cell arrays is defective based on the results of the memory scan, receiving data to be stored in a first cell array of the plurality of cell arrays, storing the received data in the first cell array if the determining determines the first cell array not to be defective and storing the received data in a second cell array, if the determining determines the first cell array to be defective.

Another example embodiment of the present invention is directed to a method of retrieving data from an embedded memory, including receiving data on a first scan output line from a first cell array, included among a plurality of cell arrays, if the first cell array is not defective and receiving data on the first scan line from a second cell array if the first cell array is defective.

Another example embodiment of the present invention is directed to an embedded memory capable of performing column redundancy repair and a scan with connections on a layout of a conventional embedded memory.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
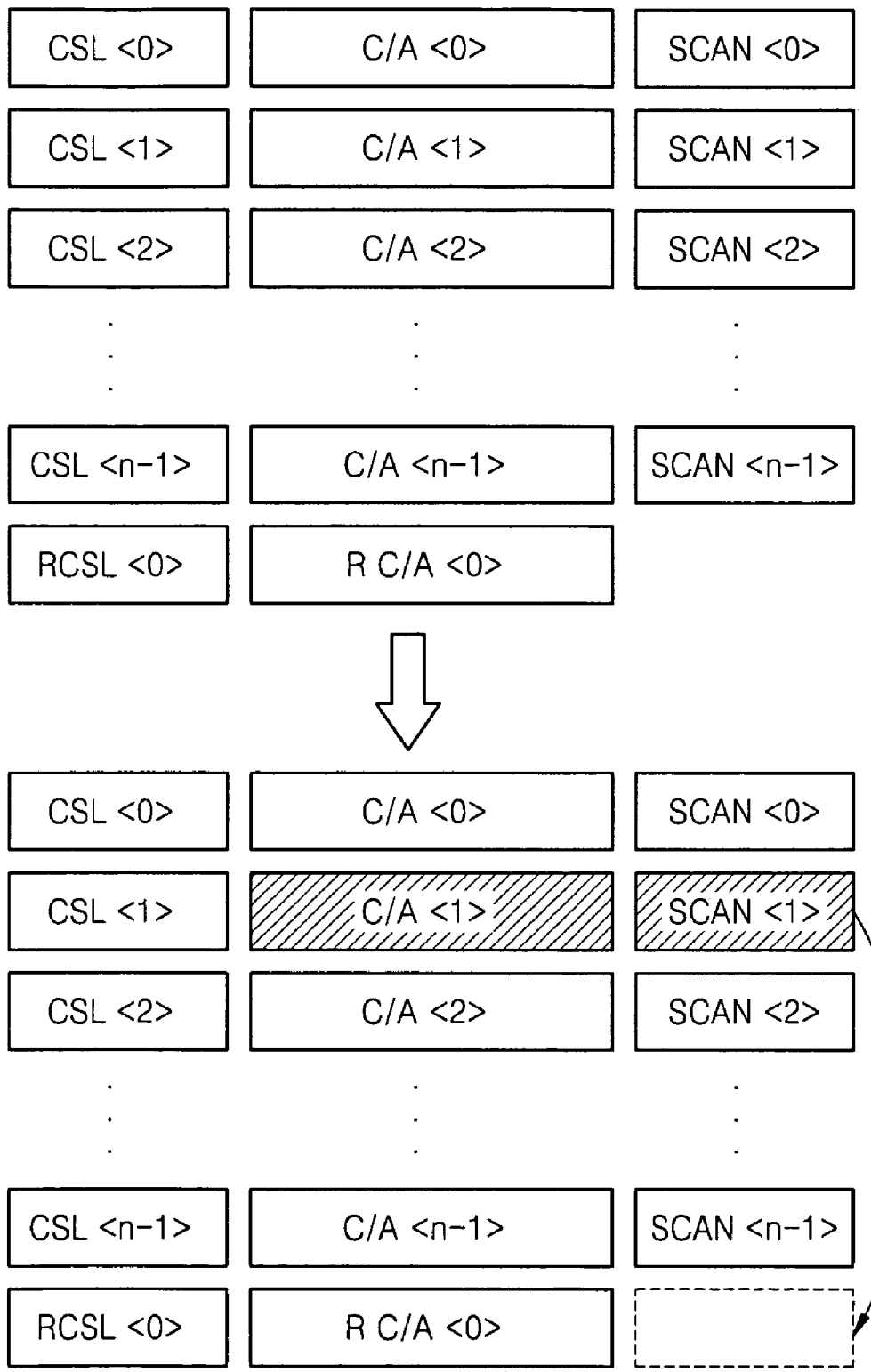
FIG. 1 is a conceptual diagram illustrating memory including scan blocks, column redundancy blocks and a column redundancy repair function performed by a conventional memory.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
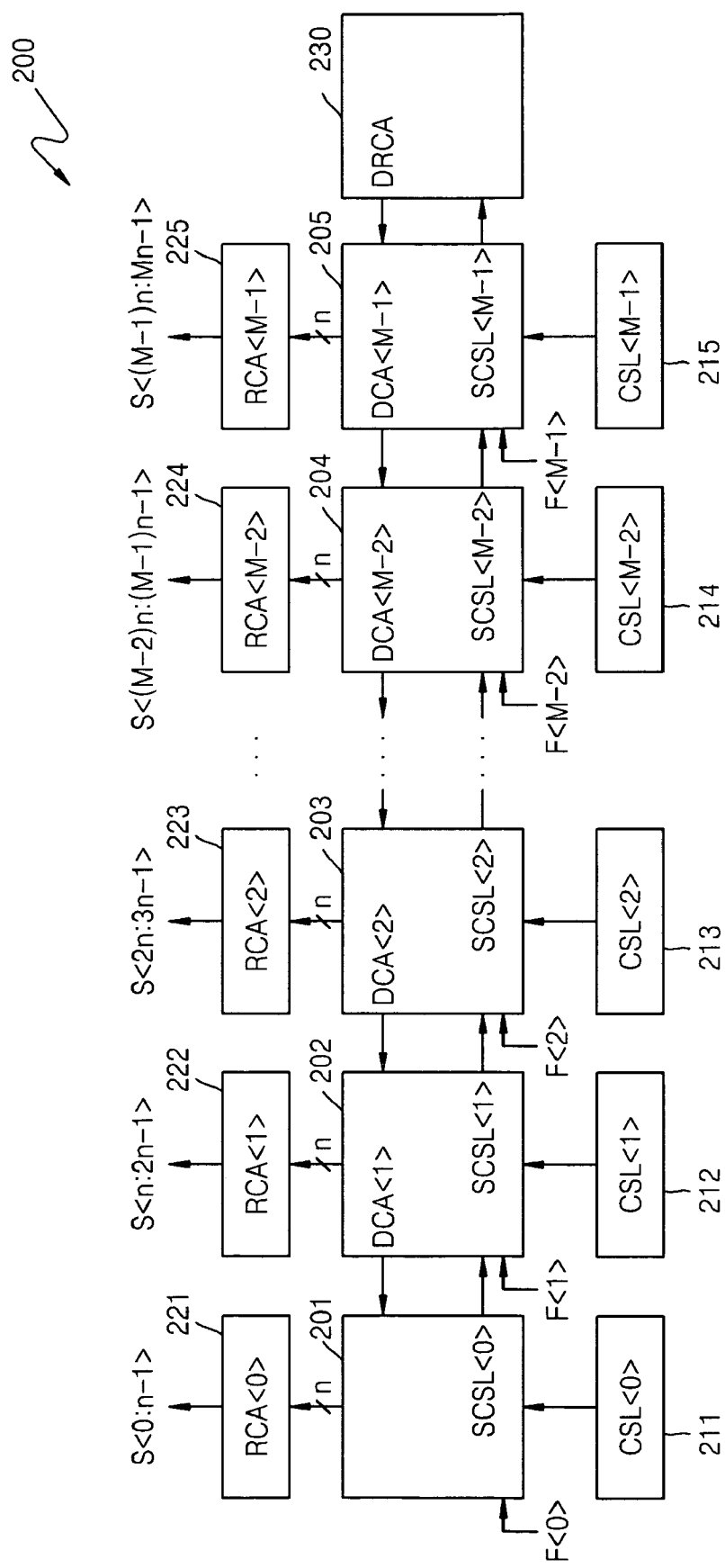
FIG. 2 is a block diagram of an embedded semiconductor device according to an example embodiment of the present invention.

FIG. 2 is a block diagram of an embedded semiconductor device 200 according to an example embodiment of the present invention.

In the example embodiment of FIG. 2, the embedded semiconductor device 200 may include a plurality of memory blocks 201 to 205, a plurality of decoder blocks 211 to 215, a plurality of scan blocks 221 to 225 and a redundancy block 230. The decoder blocks 211 to 215 may output a plurality of decoded column selection signals CSL<0> to CSL<M−1>. The scan blocks 221 to 225 may scan a plurality of group cell data RCA<0> to RCA<M−1>. The memory blocks 201 to 205 may be serially connected one another.

In the example embodiment of FIG. 2, a zeroth memory block 201 may include a first cell array CA<0> and may output zeroth group cell array data RCA<0> selected from data DCA<0> of the zeroth cell array CA<0> corresponding to a zeroth group column selection signal CSL<0> decoded in response to a zeroth fuse signal F<0> and data DCA<1> of a first cell array CA<1> applied from a first memory block 202. The zeroth memory block 201 may output a shifted zeroth group column selection signal SCSL<0>.

In the example embodiment of FIG. 2, the first memory block 202 may include a first cell array CA<1> and may output first group cell array data RCA<1> selected from data DCA<1> of the first cell array CA<1> corresponding to a first group column selection signal CSL<1> decoded in response to a first fuse signal F<1> or the shifted zeroth group column selection signal SCSL<0> and data DCA<2> of a second cell array CA<2> applied from a second memory block 203. In an example, the first memory block 202 may output a shifted first group column selection signal SCSL<1> having the same electrical characteristic as the decoded first group column selection signal CSL<1>.

In the example embodiment of FIG. 2, a (M–2)-th memory block 204 may include a (M–2)-th cell array CA<M–2> and may output (M–2)-th group cell array data RCA<M–2> selected from data DCA<M–2> of the (M–2)-th cell array CA<M–2> corresponding to a (M–2)-th group column selection signal CSL<M–2> decoded in response to a (M–2)-th fuse signal F<M–2> or a shifted (M–3)-th group column selection signal SCSL<M–3> and data DCA<M–1> of a (M–1)-th cell array CA<M–1> applied from a (M–1)-th memory block 205. In an example, the (M–2)-th memory block 204 may output a shifted (M–2)-th group column selection signal SCSL<M–2> having the same electrical characteristic as the decoded (M–2)-th group column selection signal CSL<M–2>.

In the example embodiment of FIG. 2, the (M–1)-th memory block 205 may include a (M–1)-th cell array CA<M–1> and may output (M–1)-th group cell array data RCA<M–1> selected from data DCA<M–1> of the (M–1)-th cell array CA<M–1> corresponding to a (M–1)-th group column selection signal CSL<M–1> decoded in response to a (M–1)-th fuse signal F<M–1> or the shifted (M–2)-th group column selection signal SCSL<M–2> and data DRCA of the redundancy cell array RCA applied from the redundancy block 230. In an example, the (M–1)-th memory block 205 may output a shifted (M–1)-th group column selection signal SCSL<M–1> having the same electrical characteristic as the decoded (M–1)-th group column selection signal CSL<M–1>.

In the example embodiment of FIG. 2, the redundancy block 230 may include a redundancy cell array RCA and may output data DRCA of the redundancy cell array RCA corresponding to the shifted (M–1)-th group column selection signal SCSL<M–1>.

Figure 3:
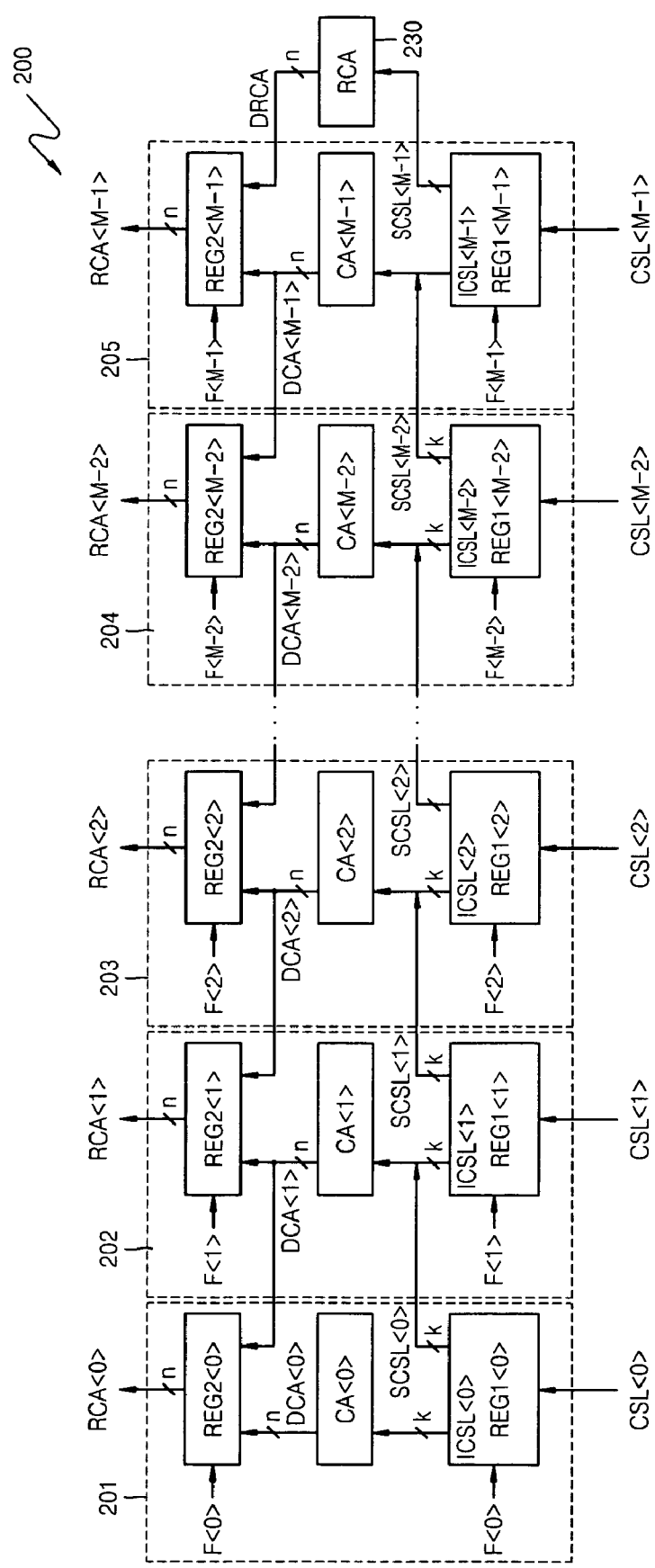
FIG. 3 is a block diagram illustrating the embedded semiconductor device of FIG. 2 in greater detail according to another example embodiment of the present invention.

FIG. 3 is a block diagram illustrating the embedded semiconductor device 200 of FIG. 2 in greater detail according to another example embodiment of the present invention.

In the example embodiment of FIG. 3, the memory blocks 201 to 205 may include first register blocks REG1<0> to REG1<M–1>, the cell arrays CA<0> to CA<M–1> and second register blocks REG2<0> to REG2<M–1>. The redundancy block 230 may include the redundancy cell RCA. The zeroth memory block 201 may include the first register block REG1<0>, the cell array CA<0> and the second register block REG2<0>.

In the example embodiment of FIG. 3, the first register block REG1<0> may store the input decoded zeroth group column selection signal CLS<0> and may output an internal group column selection signal ICSL<0> and the shifted group column selection signal SCSL<0>. The cell array CA<0> may output the cell data DCA<0> corresponding to the internal group column selection signal ICSL<0>. The second register block REG2<0> may store and output the group cell array data RCA<0> selected from the data DCA<0> output from the cell array CA<0> in response to the fuse signal F<0> and the cell data CA<1> applied from the first memory block 202. In an example, the shifted group column selection signal SCSL<0> may be transmitted to the first memory block 202.

In the example embodiment of FIG. 3, although the decoded group column selection signal CSL<0> may include a plurality of bits, the decoded group column selection signal CSL<0> has been illustrated as being a signal having a single bit. Accordingly, it will be appreciated that, while not shown, each of the first register blocks may include additional registers (e.g., in additional to the single, illustrated, register).

Likewise, although data output from the cell array CA may be a plurality of bits, for convenience of explanation, the data output from the cell array CA may be illustrated and described below as a single bit. Accordingly, it will be appreciated that, while not shown, each of the second register blocks may include additional registers.

In the example embodiment of FIG. 3, the first memory block 202 may include the first register block REG1<1>, the cell array CA<1> and the second register block REG2<1>. Generally, the structure of the first memory block 202 and the (M–2)-th memory block 204 may correspond to those of the zeroth memory block 201. Accordingly, a further description thereof has been omitted for the sake of brevity. In contrast, in the (M–1)-th memory block 205, cell data applied to the second register block from an external source may be received from the redundancy block 230 (e.g., and not from another memory block within embedded semiconductor memory device 200).

Figure 4:
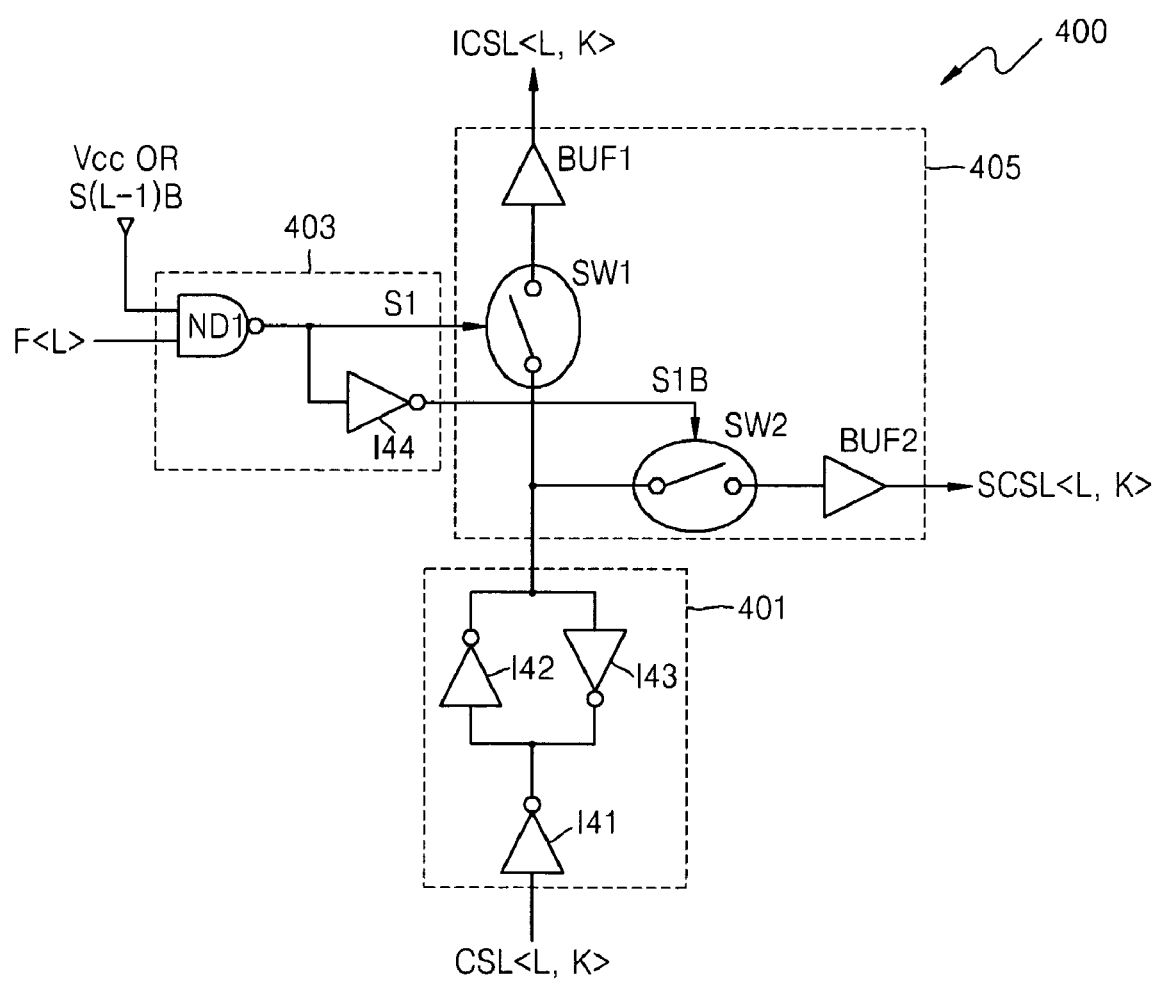
FIG. 4 is a circuit diagram of a register according to another example embodiment of the present invention.

FIG. 4 is a circuit diagram of a register 400 according to another example embodiment of the present invention. In an example, the register 400 of FIG. 4 may be representative of one or more of the first register blocks REG1<1> to REG<M–1> of FIGS. 2 and 3, respectively. In the example embodiment of FIG. 4, the register 400 may include a latch circuit 401, a path selection signal generating circuit 403 and a switch circuit 405.

In the example embodiment of FIG. 4, the latch circuit 401 may store and output the decoded group column selection signal CSL<L,K>. The latch circuit 401 may include a first inverter I41 inverting a phase of the group column selection signal CSL<L,K> and latch blocks I42 and I43 inverting an output phase of the first inverter, and storing and outputting the inverted output phase. In an example, L and K may be integers, and <L,K> may denote a K-th bit of an L-th block of the first register blocks.

In the example embodiment of FIG. 4, the path selection signal generating circuit 403 may generate a path selection signal and an inverse path selection signal S1B having a phase inverse to that of the path selection signal S1 in response to the fuse signal F<L> and a source voltage Vcc. The path selection signal generating circuit 403 may include a NAND gate ND1 outputting the path selection signal S1 corresponding to the source voltage Vcc and the fuse signal F<L> and a fourth inverter I44 inverting the phase of the path selection signal S1 and outputting the inverse path selection signal S1B.

In the example embodiment of FIG. 4, the switch circuit 405 may output the group column selection signal stored in the latch circuit 401, as the internal column selection signal ICSL<L,K> or the shifted group path selection signal SCSL<L,K>, in response to the path selection signal S1 and the inverse path selection signal S1B. The switch circuit 405 may include first and second switches SW1 and SW2. The first switch SW1 may output the internal group column selection signal ICSL<L,K> by switching the group column selection signal stored in the latch circuit 401 connected to a given end of the switch circuit 405 in response to the path selection signal S1. The second switch SW2 may output the shifted group column selection signal SCSL<L,K> by switching the group column selection signal stored in the latch circuit 401 connected the given end of the switch circuit 405 in response to the inverse path selection signal S1B. The internal group column selection signal ICSL<L,K> and the shifted group path selection signal SCSL<L,K> may be selectively enabled, and therefore, a corresponding group column selection signal may be supplied to the selected cell array.

In the example embodiment of FIG. 4, the switch circuit 405 may include first and second buffers BUF1 and BUF2 which may be configured to improve a driving performance of the output signals ICSL<L,K> and SCSL<L,K>. The first buffer BUF1 may buffer the internal group column selection signal ICSL<L,K>. The second buffer BUF2 may buffer the shifted group column selection signal SCSL<L,K>.

In the example embodiment of FIG. 4, while not shown in FIG. 2 or 3, the first memory block 202 may receive the inverse path selection signal generated in the zeroth memory block 201, the second memory block 203 may receive the inverse path selection signal generated in the first memory block 202, and so on, such that the (M−1)-th memory block 205 may receive the inverse path selection signal generated in the (M−2)-th memory block 204. The path selection signal generating circuit included in each respective memory block may generate the path selection signal corresponding to the corresponding fuse signal and the received inverse path selection signal and the inverse selection signal having a phase inverse to that of the path selection signal. That is, the inverse path selection signal S(L−1)B generated in a previous or preceding memory block (e.g., instead of the source voltage Vcc) may be input into the NAND gate ND1.

Figure 5:
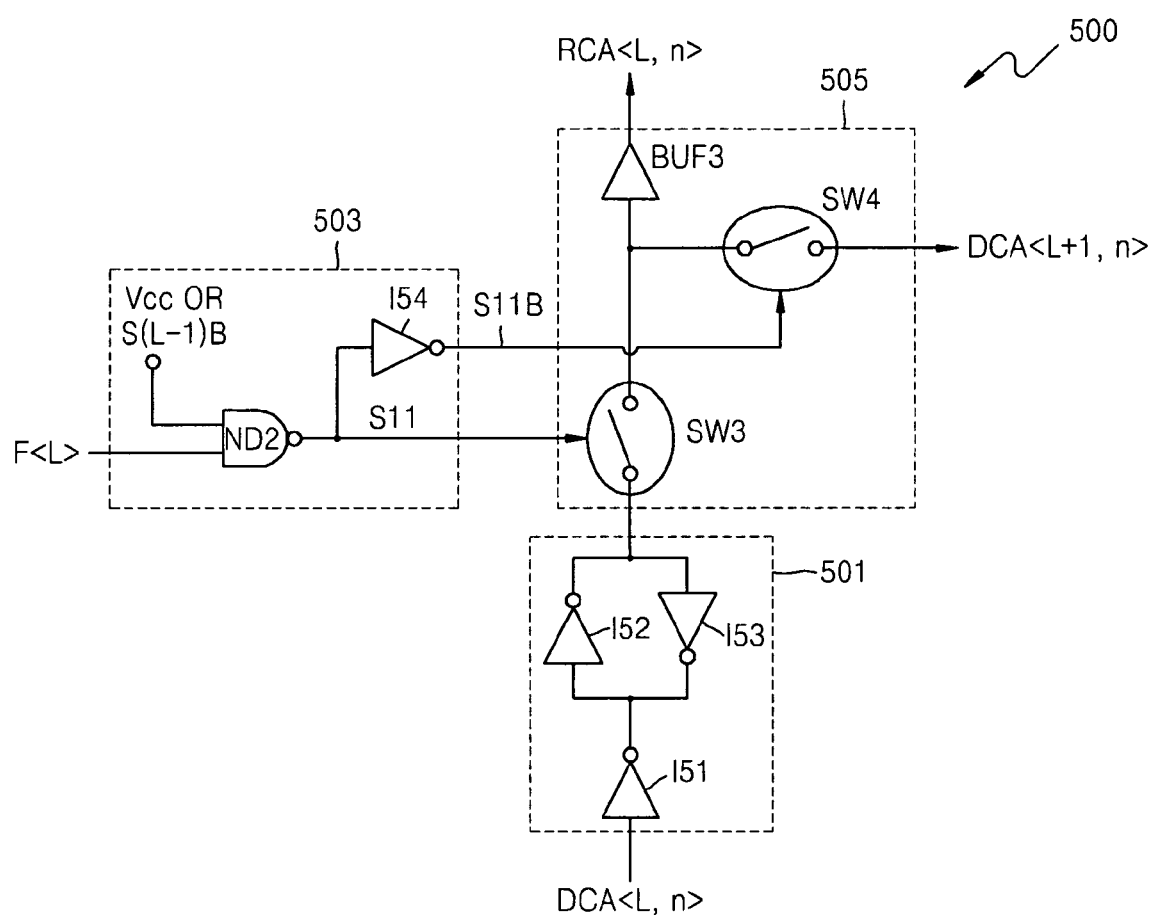
FIG. 5 is a circuit diagram of another register according to another example embodiment of the present invention.

FIG. 5 is a circuit diagram of a register 500 according to another example embodiment of the present invention. In an example, the register 500 of FIG. 5 may be representative of one or more of the second register blocks REG2<0> to REG2<M−1> of FIG. 3. In the example embodiment of FIG. 5, the register 500 may include a latch circuit 501, a path selection signal generating circuit 503 and a switch circuit 505.

In the example embodiment of FIG. 5, the latch circuit 501 may store and output the corresponding cell array data DCA<L,n>, wherein n may be an integer. The latch circuit 501 may include a first inverter I51 inverting a phase of the cell array data DCA<L,n> and latch blocks I52 and I53 inverting an output phase of the first inverter, and storing and outputting the inverted output phase.

In the example embodiment of FIG. 5, the path selection signal generating circuit 503 may include a NAND gate ND2 outputting the path selection signal S11 corresponding to the source voltage Vcc and the fuse signal F<L> and a fourth inverter I54 inverting the phase of the path selection signal S11 and outputting the inverse path selection signal S11B.

In the example embodiment of FIG. 5, the first memory block 202 may receive the inverse path selection signal generated in the zeroth memory block 201, the second memory block 203 may receive the inverse path selection signal generated in the first memory block 202, and so on, such that the (M−1)-th memory block 205 may receive the inverse path selection signal generated in the (M−2)-th memory block 204. The path selection signal generating circuit included in each respective memory block may generate a path selection signal corresponding to a corresponding fuse signal, the received inverse path selection signal and the inverse selection signal having a phase inverse to that of the path selection signal. Thus, instead of the source voltage Vcc, the inverse path selection signal S(L−1)B generated in a previous or preceding memory block may be input into the NAND gate ND2.

In the example embodiment of FIG. 5, the switch circuit 505 may include first and second switches SW3 and SW4. A first switch SW3 may output the group cell array data RCA<L,n> by switching the cell array data stored in the latch circuit 501 connected to a first end of the switch circuit 505 in response to the path selection signal S11. A second switch SW4 connected to the second end of the switch circuit 505 may output the group cell array data DCA<(L+1),n> by switching the cell array data DCA<(L+1),n> applied from an external source in response to the inverse path selection signal S11B. The switch circuit 505 may further include a buffer BUF3 buffering the group cell array data.

Figure 6A:
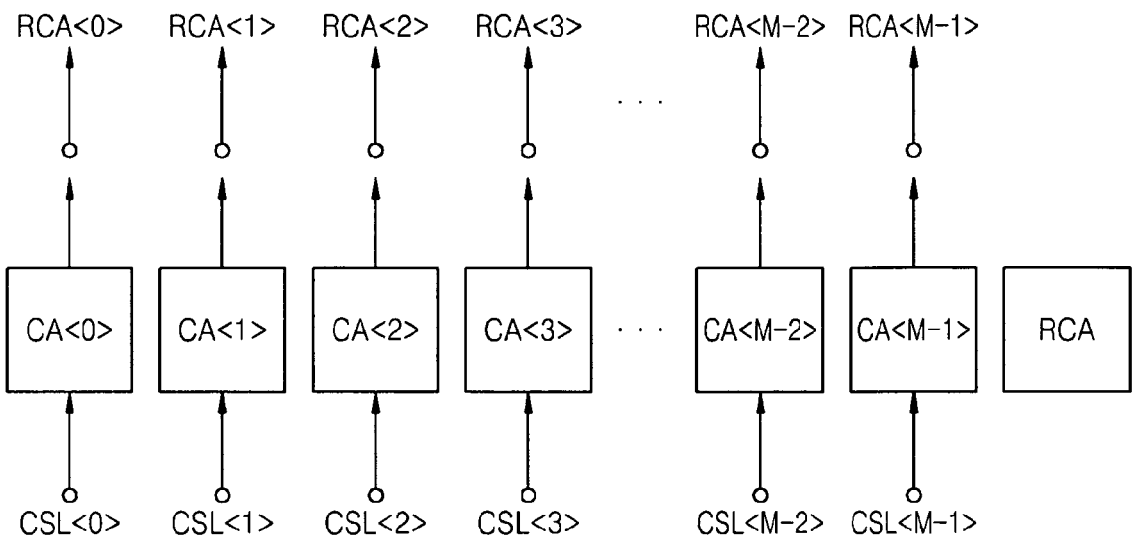
FIG. 6A illustrates a condition where a memory scan is performed and no errors are detected in accordance with another example embodiment of the present invention.

FIG. 6A illustrates a condition where a memory scan is performed and no errors are detected in accordance with another example embodiment of the present invention. In the example embodiment of FIG. 6A, the memory scan may scan a plurality of cell arrays CA<0> to CA<M−1>, which may collectively constitute an embedded memory. Group cell array data RCA<0> to RCA<M−1> corresponding to the column selection signals CSL<0> to CSL<M−1> may be output. Here, signal lines RCA<0> to RCA<M−1>, through which the group cell array data may be output, may be "fixed" in terms of layout, because no physical wiring adjustments need be made to correct for defective memory (e.g., because the default wiring conditions may be sufficient in a no-defect scenario).

Figure 6B:
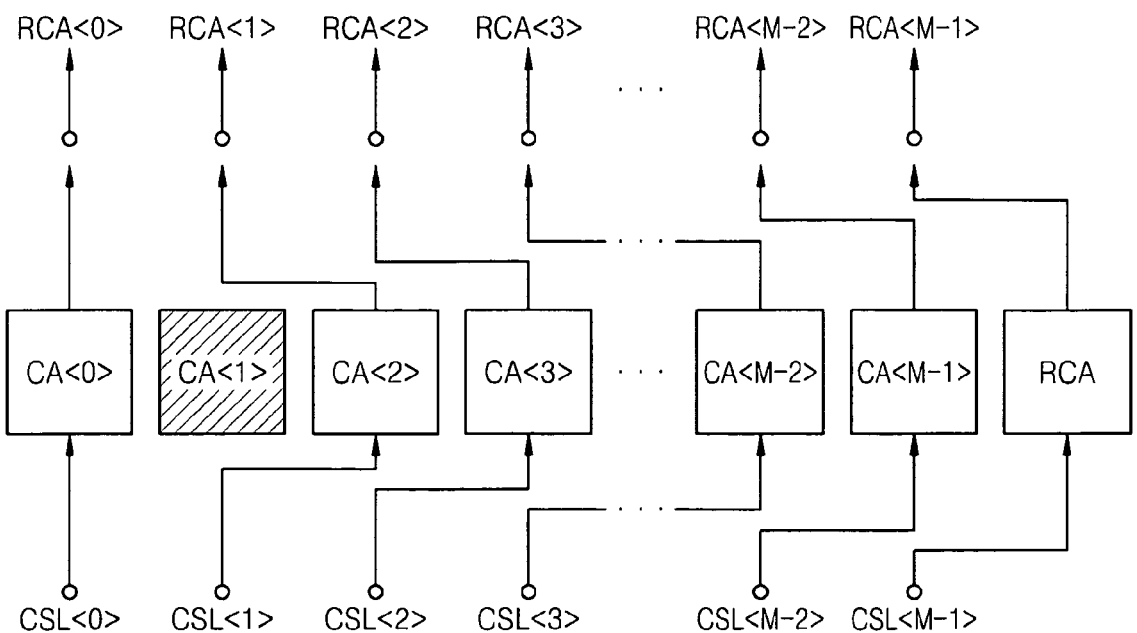
FIG. 6B illustrates a condition where a memory scan is performed and an error is detected in accordance with another example embodiment of the present invention.

FIG. 6B illustrates a condition where a memory scan is performed and an error is detected in accordance with another example embodiment of the present invention. As shown in the example embodiment of FIG. 6, an error may be detected in the first cell array CA<1>. However, it is understood that other example embodiments may be directed to memory scans detecting an error in any cell array among the plurality of cell arrays CA<0> to CA<M−1> (e.g., or more than one cell array).

Example operation of performing a redundancy operation to record data to the first cell array CA<1> in response to a detected error of the first cell array CA<1> will now be described in greater detail with reference to FIG. 6B.

In example operation of the redundancy operation, referring to FIG. 6B, each of the plurality of cell arrays CA<0> to CA<M−1> may use a "matched" or corresponding column selection signal before an error or defect is detected (e.g., as shown in FIG. 6A). Thus, a zeroth column selection signal CSL<0> may correspond to a zeroth memory cell CA<0>, and so on. In contrast, if a defective memory cell is detected, each memory cell positioned to the "right" of the defective memory cell may be switched so as to correspond with a column selection signal for the previous memory cell (e.g., an adjacent cell to the "left"). Thus, for the case of a memory cell directly to the right of a defective memory cell, the column selection signal for the defective memory cell may be switched so as to correspond to the memory cell directly to the right of the defective memory cell, and so on. The column selection signal CSL<M−1> may thereby be configured to correspond with the redundancy cell array instead of the memory cell CA<M−1>, as shown in FIG. 6B. However, it is understood that other example embodiments may be configured to comply with any redundancy configuration. For example, the column selection signal need not be shifted to the "right" in response to a defective memory cell, but rather may be configured to be shifted to the "left". Further, the redundancy cell array need not be at a "right" or "left" end of the memory cell array, but rather may be positioned between any of the memory cells CA<0> to CA<M−1>. The above redundancy process will now be described in greater detail with respect to the particular example implementation illustrated in FIG. 6B.

In example operation of the redundancy operation, referring to FIG. 6B, data may be recorded in the zeroth cell array CA<0> in correspondence with the zeroth column selection signal CSL<0>. Data may be recorded in the second cell array CA<2> instead of the first cell array CA<1> (e.g., where the error or defect is determined to have occurred), in correspondence with the first column selection signal CSL<1>. Data may be recorded in a third cell array CA<3> in correspondence with the second column selection signal CSL<2>. Data may be recorded in the (M−1)-th cell array CA<M−1> in correspondence with the (M−2) column selection signal CSL<M−2>. Data may be recorded in the redundancy cell array RCA in correspondence with the (M−1)-th column selection signal CSL<M−1>.

In example operation of the redundancy operation, referring to FIG. 6B, each given cell array within an embedded memory in which an error does not occur may transmit the group cell array data to an output line which may be connected to the given cell array. In contrast, if a defective cell array or memory block is determined within an embedded memory, the corresponding group cell array data to be output from the "adjusted" cell arrays (e.g., cell arrays to the "right" of a defected or bypassed memory cell) may be shifted to a signal line located to the "left" of the corresponding cell array and output. Accordingly, a memory scan may be performed after a redundancy repair operation is performed without having to change existing scan data output signal lines and/or forming new scan lines.

In example operation of the redundancy operation, referring to FIG. 6B, the zeroth cell array CA<0> may output the zeroth group cell array data RCA<0> corresponding to the zeroth column selection signal CSL<0>. The second cell array CA<2> may output the first group cell array data RCA<1> corresponding to the first column selection signal CSL<1>. The first group cell array data RCA<1> may also be connected to the output line located over the first cell array CA<1> in which an error occurs, and therefore, a previous connection structure may not be changed. Similarly, the cell arrays corresponding to the subsequent column selection signals may be shifted to the right by one, and the output group cell array data may be shifted to the left by one. Thus, the cell arrays may be adjusted so as to compensate for a defective memory cell without requiring a new connection structure. The group cell array data stored in the redundancy cell array RCA may be output to the signal line located over the (M−1)-th cell array CA<M−1> using the column selection signal CSL<M−1>.

Figure 7:
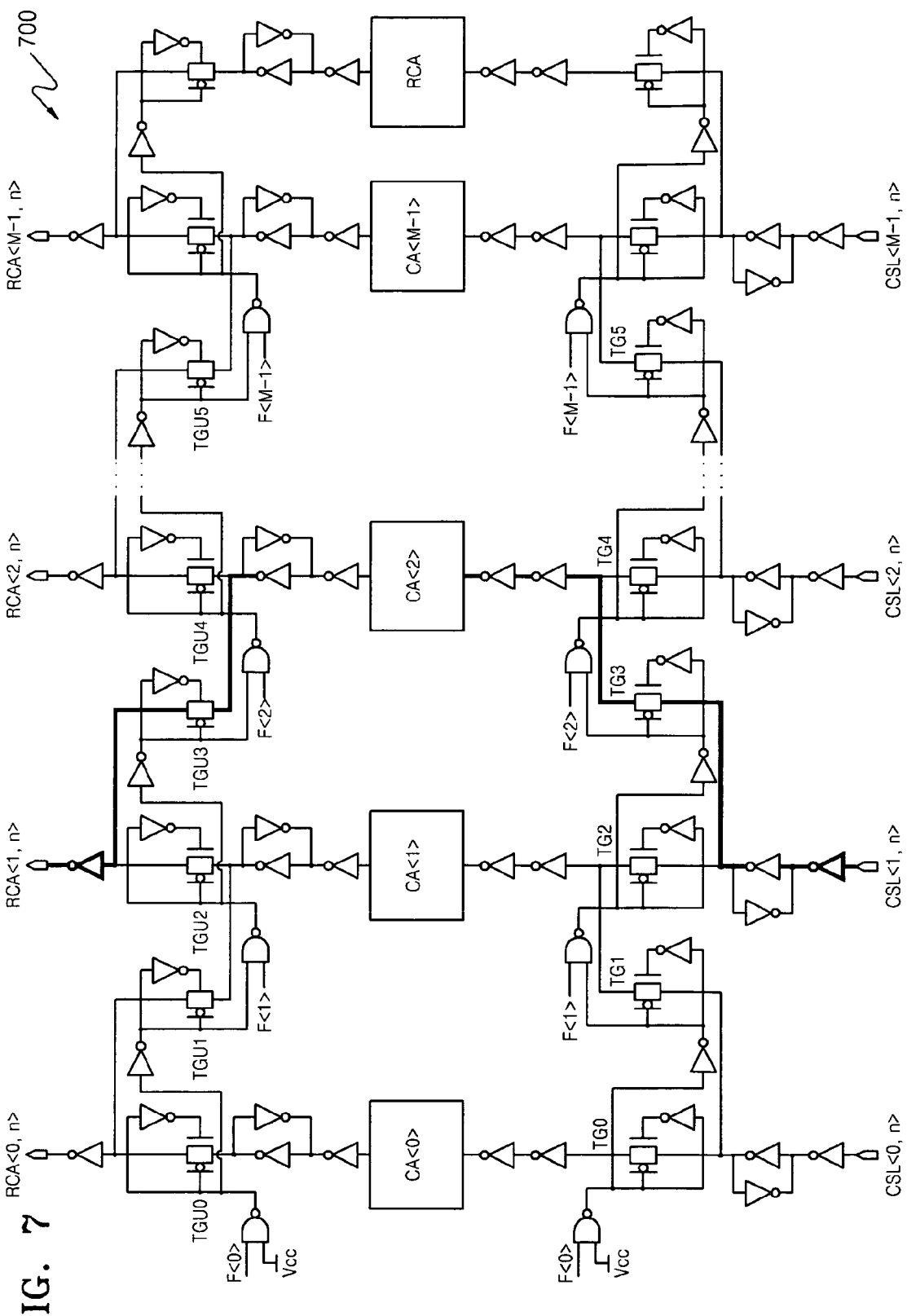
FIG. 7 is a circuit diagram illustrating a portion of the embedded semiconductor memory device of FIG. 2 according to another example embodiment of the present invention.

FIG. 7 is a circuit diagram illustrating a portion of the embedded semiconductor memory device 200 of FIG. 2 according to another example embodiment of the present invention.

In the example embodiment of FIG. 7, a path through which data, which may be initially configured to be stored in the first cell array CA<1> (e.g., which may be determined to be defective), may be alternatively stored in the second cell array CA<2>, as well as a path through which data may be read or "scanned" from the second cell array CA<2> (e.g., acting as the first cell array CA<1>), may be denoted by bold lines.

Hereinafter, an example process of performing a column redundancy repair in an embedded memory will be described. In the example process described below, for purposes of explanation, it may be assumed that the column redundancy cell may be located to the "right" of the cell array. However, an example where the column redundancy cell is located on the "left" of the plurality of cell arrays will be readily understood by one of ordinary skill in the art, as would an example wherein the column redundancy cell is located in an "intervening" manner among the plurality of cell arrays (e.g., between memory cells, neither on the right or the left, etc.).

Accordingly, an example process of performing a column redundancy repair may include detecting a location of a defective memory cell array among a plurality of memory cell arrays (e.g., by performing a memory scan and evaluating the results of the memory scan). After detecting the defective memory cell, data configured or scheduled to be recorded in the defective cell array may be alternatively recorded in a first alternative memory cell (e.g., a next or adjacent memory cell to the "right" of the defective memory cell). Likewise, data scheduled to be recorded into the first alternative memory cell may be recorded in a second alternative memory cell (e.g., a next memory cell to the "right" of the first alternative memory cell), and so on, until data scheduled to be recorded into a right-most memory cell may be alternatively recorded into a redundancy memory cell. Thus, without physically rewiring the embedded semiconductor memory device, a defective cell array or memory block may be "bypassed" by having each cell array, in a given direction from the defective cell array, switch so as to act as the "previous" cell array (e.g., with a redundancy cell configured to act as, or compensate for, the switching of the "last" cell array).

An example process of reading data from a plurality of memory cells which have been repaired in accordance with the above example column redundancy repair process will now be described. In the example process of reading data, data of the cell array located to the "left" of the defective memory cell may be output through an existing scan output line (e.g., without change). Thus, if a third memory cell is defective, a second memory cell may output data on a corresponding second scan output line. Data of the cell array located to the "right" of the defective memory cell may be output through a preceding scan output line (e.g., shifted by one memory cell to the "left"). Thus, if the third memory cell is defective, a fourth memory cell may output data on a third scan output line (e.g., originally corresponding to the third memory cell), and so on.

Example embodiments of the present invention being thus described, it will be obvious that the same may be varied in many ways. For example, while the example embodiments of the present invention illustrate examples where adjacent memory cells may be used to compensate for a defective memory cell (e.g., to simplify wiring for the switching to an alternative memory cell in case of a defect), it will be appreciated that other example embodiments of the present invention may include any of the plurality of cell arrays configured to replace or act as a defective cell array.

Such variations are not to be regarded as a departure from the spirit and scope of example embodiments of the present invention, and all such modifications as would be obvious to one skilled in the art are intended to be included within the scope of the following claims.

What is claimed is:

1. An embedded memory, comprising:
    a first memory block configured to output data, selected by a first column select signal, on a first scan output line if the first memory block is determined to be non-defective; and
    a second memory block configured to output data, selected by a second column select signal on a second scan output line if the first memory block is determined to be non-defective, the second memory block further configured to output data, selected by the first column select signal, on the first scan output line if the first memory block is determined to be defective, wherein each of the first and second memory blocks includes a first register block, a cell array and a second register block.

2. The embedded memory of claim 1, further comprising:
    a redundancy block configured to output data, selected by the second column select signal, on the second scan output line if the second memory block is determined to be defective.

3. The embedded memory of claim 1, wherein the first and second memory blocks are physically adjacent to each other among a plurality of memory blocks included within the embedded memory.

4. The embedded memory of claim 1, wherein, if the first memory block is defective, a response to a memory request for data stored in the first memory block is output from the second memory block.

5. The embedded memory of claim 1, further comprising:
a decoder block generating the first and second column selection signals; and
a scan block used to scan the first and second memory blocks to determine whether at least one of the first and second memory blocks is defective.

6. A method of repairing the embedded memory of claim 1.

7. A method of retrieving data from the embedded memory of claim 1.

8. An embedded memory comprising:
a first memory block configured to output data, selected by a first column select signal, on a first scan output line if the first memory block is determined to be non-defective; and
a second memory block configured to output data, selected by a second column select signal on a second scan output line if the first memory block is determined to be non-defective, the second memory block further configured to output data, selected by the first column select signal, on the first scan output line if the first memory block is determined to be defective, wherein the second memory block includes a first register block, a cell array and a second register block.

9. The embedded memory of claim 8, wherein the first register block outputs one of the first and second column select signals in response to a fuse signal, the cell array outputs data selected by the output column select signal and the second register receives and outputs the output data from the cell array in response to the fuse signal.

10. The embedded memory of claim 8, wherein the first register block, the second column select signal as a first default column select signal and the first column select signal is a shifted column select signal shifted from the second column select signal.

11. The embedded memory of claim 10, wherein the first memory block includes another first register block storing the first column select signal as a second default column select signal.

12. The embedded memory of claim 9, wherein the first register block includes a plurality of registers.

13. The embedded memory of claim 12, wherein each of the plurality of registers includes:
a latch circuit storing and outputting a decoded group column selection signal;
a path selection signal generation circuit generating a path selection signal and an inverted path selection signal in response to the fuse signal and a source voltage; and
a switch circuit outputting the group column selection signal stored in the latch circuit as one of an internal column selection signal and a shifted group path selection signal.

14. The embedded memory of claim 13, wherein the latch circuit includes:
a first inverter inverting a phase of the group column selection signal; and
a latch block inverting an output phase of the first inverter, storing the inverted output phase and outputting the inverted output phase.

15. The embedded memory of claim 14, wherein the path selection signal generating circuit includes:

a NAND gate outputting the path selection signal corresponding to the source voltage and the fuse signal; and
a fourth inverter inverting the phase of the path selection signal and outputting the inverted path selection signal.

16. The embedded memory of claim 15, wherein the switch circuit includes:
a first switch outputting the internal group column selection signal by switching the group column selection signal stored in the latch circuit connected to a first end of the switch circuit in response to the path selection signal; and
a second switch outputting the shifted group column selection signal by switching the group column selection signal stored in the latch circuit connected to a second end of the switch circuit in response to the inverted path selection signal.

17. The embedded memory of claim 16, wherein the switch circuit includes:
a first buffer buffering the internal group column selection signal; and
a second buffer buffering the shifted group column selection signal.

18. The embedded memory of claim 16, wherein the second memory block receives the inverted path selection signal generated in the first memory block and
wherein the first memory block receives the inverted path selection signal generated in the second memory block.

19. The embedded memory of claim 18, wherein the NAND gate outputs the path selection signal corresponding to the fuse signal and the received inverse path selection signal, and wherein the fourth inverter inverts the phase of the path selection signal and outputs the inverted path selection signal.

20. The embedded memory of claim 9, wherein the second register block includes a plurality of registers.

21. The embedded memory of claim 20, wherein each of the plurality of registers includes:
a latch circuit storing cell array data;
a path selection signal generation circuit generating a path selection signal and an inverted path selection signal in response to the fuse signal and a source voltage; and
a switch circuit outputting group cell array data selected at least in part from the cell array data stored in the latch circuit, in response to the path selection signal and the inverted path selection signal.

22. The embedded memory of claim 21, wherein the latch circuit includes:
a first inverter inverting a phase of the cell array data; and
a latch block inverting an output phase of the first inverter, storing the inverted output phase and outputting the inverted output phase.

23. The embedded memory of claim 22, wherein the path selection signal generating circuit includes:
a NAND gate outputting the path selection signal corresponding to the source voltage and the fuse signal; and
a fourth inverter inverting the phase of the path selection signal and outputting the inverse path selection signal.

24. The embedded memory of claim 23, wherein the switch circuit includes:
a first switch outputting the group cell array data by switching the cell array data stored in the latch circuit connected to a first end of the switch circuit in response to the path selection signal; and
a second switch connected to a second end of the switch circuit outputting the group cell array data by switching the cell array data applied from outside in response to the inverse path selection signal.

25. The embedded memory of claim 24, wherein the switch circuit further comprises:
a buffer buffering the group cell array data.

26. The embedded memory of claim 12, wherein the first memory block receives the inverted path selection signal generated in the second memory block, and wherein the second memory block receives the inverted path selection signal generated in the first memory block.

27. The embedded memory of claim 26, wherein the NAND gate outputs the path selection signal based on the fuse signal and the received inverted path selection signal, and wherein the fourth inverter inverts the phase of the path selection signal and outputs the inverted path selection signal.

* * * * *